(12) United States Patent
Gang et al.

(10) Patent No.: US 12,484,401 B2
(45) Date of Patent: Nov. 25, 2025

(54) ORGANIC LIGHT EMITTING DISPLAY DEVICE AND ORGANIC LIGHT EMITTING DISPLAY PANEL

(71) Applicant: LG Display Co., Ltd., Seoul (KR)

(72) Inventors: ByeongUk Gang, Paju-si (KR); InHyo Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 468 days.

(21) Appl. No.: 17/976,392

(22) Filed: Oct. 28, 2022

(65) Prior Publication Data

US 2023/0217742 A1    Jul. 6, 2023

(30) Foreign Application Priority Data

Dec. 31, 2021  (KR) .................. 10-2021-0194312

(51) Int. Cl.
| | | |
|---|---|---|
| *H10K 59/131* | (2023.01) | |
| *H10K 59/121* | (2023.01) | |
| *H10K 59/122* | (2023.01) | |
| *H10K 59/38* | (2023.01) | |
| *H10K 71/00* | (2023.01) | |
| *H10K 59/12* | (2023.01) | |

(52) U.S. Cl.
CPC ....... *H10K 59/131* (2023.02); *H10K 59/1216* (2023.02); *H10K 59/122* (2023.02); *H10K 59/38* (2023.02); *H10K 71/00* (2023.02); *H10K 59/1201* (2023.02)

(58) Field of Classification Search
CPC .. H10K 71/00; H10K 59/1201; H10K 59/124; H10K 59/121
See application file for complete search history.

(56) References Cited

U.S. PATENT DOCUMENTS

| | | |
|---|---|---|
| 2016/0049454 A1 | 2/2016 | Park et al. |
| 2018/0069066 A1 | 3/2018 | Kimura et al. |
| 2019/0103456 A1 | 4/2019 | Choi |
| 2019/0206966 A1 * | 7/2019 | Kim ............... H10K 59/1213 |

FOREIGN PATENT DOCUMENTS

| | | |
|---|---|---|
| KR | 20190070770 A | 6/2019 |
| KR | 20190083025 A | 7/2019 |

* cited by examiner

*Primary Examiner* — Fernando L Toledo
*Assistant Examiner* — Adam S Bowen
(74) *Attorney, Agent, or Firm* — Seed Intellectual Property Law Group LLP

(57) ABSTRACT

Embodiments of the disclosure relate to an organic light emitting display device and an organic light emitting display panel. Specifically, embodiments of the disclosure may provide an organic light emitting display device and an organic light emitting display panel which include a first signal line disposed between a first emission area and a second emission area and a second signal line spaced apart from the first signal line, a first insulation film disposed on the first signal line and the second signal line and having a first hole corresponding to a separation space between the first signal line and the second signal line, and a second insulation film disposed on the first insulation film, wherein the second insulation film is disposed in the separation space between the first signal line and the second signal line and the first hole of the first insulation film. Thus, it is possible to reduce the separation space between the signal lines and thus increase the area of the emission area to thereby enhance optical characteristics.

19 Claims, 11 Drawing Sheets a > b

ORGANIC LIGHT EMITTING DISPLAY DEVICE AND ORGANIC LIGHT EMITTING DISPLAY PANEL

CROSS-REFERENCE TO RELATED APPLICATION

This application claims priority to Korean Patent Application No. 10-2021-0194312, filed Dec. 31, 2021, which is hereby incorporated by reference for all purposes as if fully set forth herein.

BACKGROUND

Technical Field

Embodiments of the disclosure relate to an organic light emitting display device and an organic light emitting display panel.

Description of Related Art

An organic light emitting display device includes a thin film transistor (TFT), a storage capacitor, and a plurality of lines.

The substrate for manufacturing the organic light emitting display device includes fine patterns, such as thin film transistors, capacitors, and lines, and the organic light emitting display device is operated by complex connections between thin film transistors, storage capacitors, and lines.

Recently, the demand increased for high luminance and high resolution organic light emitting displays leads to the demand for efficient spatial arrangement between components included in the organic light emitting display device.

BRIEF SUMMARY

Embodiments of the disclosure relate to an organic light emitting display device and an organic light emitting display panel capable of enhancing optical characteristics by decreasing the spacing between the signal lines arranged in the circuit area and hence increasing the emission area.

Embodiments of the disclosure relate to an organic light emitting display device and an organic light emitting display panel capable of facilitating a process of forming signal lines arranged adjacent to each other and reducing defects.

Embodiments of the disclosure may provide an organic light emitting display device including an organic light emitting display panel including a first emission area and a second emission area disposed adjacent to the first emission area and emit a different color of light from the first emission area, comprising a substrate, a first signal line disposed on the substrate between the first emission area and the second emission area and a second signal line spaced apart from the first signal line, a first insulation film disposed on the first signal line and the second signal line and having a first hole corresponding to a separation space between the first signal line and the second signal line, and a second insulation film disposed on the first insulation film, wherein the second insulation film is disposed in the separation space between the first signal line and the second signal line and the first hole of the first insulation film.

Embodiments of the disclosure may provide an organic light emitting display panel, comprising a substrate including a first emission area and a second emission area disposed adjacent to the first emission area and emit a different color of light from the first emission area, a first signal line disposed on the substrate between the first emission area and the second emission area and a second signal line spaced apart from the first signal line, a first insulation film disposed on the first signal line and the second signal line and having a first hole corresponding to a separation space between the first signal line and the second signal line, and a second insulation film disposed on the first insulation film, wherein the second insulation film is disposed in the separation space between the first signal line and the second signal line and the first hole of the first insulation film.

Effects of the Disclosure

According to embodiments of the disclosure, there may be provided an organic light emitting display device and an organic light emitting display panel capable of enhancing optical characteristics by decreasing the spacing between the signal lines arranged in the circuit area and hence increasing the emission area.

According to embodiments of the disclosure, there may be provided an organic light emitting display device and an organic light emitting display panel capable of facilitating a process of forming signal lines arranged adjacent to each other and reducing defects.

DESCRIPTION OF THE SEVERAL VIEWS OF THE DRAWINGS

The above and other benefits, features, and advantages of the disclosure will be more clearly understood from the following detailed description, taken in conjunction with the accompanying drawings, in which.

DETAILED DESCRIPTION

Figure 1:
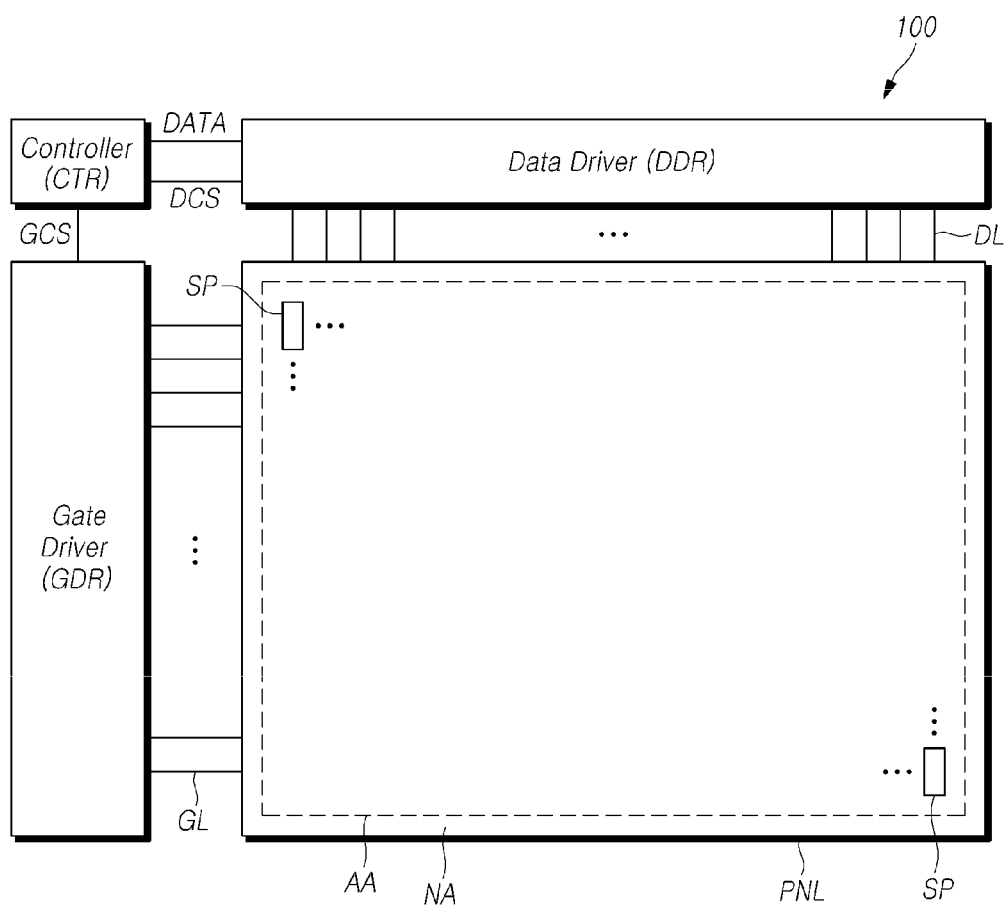
FIG. 1 is a view schematically illustrating a system configuration of an organic light emitting display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein may be omitted when it is determined that the description may make the subject matter in some embodiments of the disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, various embodiments of the disclosure are described in detail with reference to the accompanying drawings.

FIG. 1 is a view schematically illustrating a system configuration of an organic light emitting display device according to embodiments of the disclosure.

An organic light emitting display device may include the organic light emitting display device 100 according to embodiments of the disclosure, a lighting device, or a light emitting device. For convenience of description, the following description focuses primarily on the organic light emitting display device 100. However, embodiments of the disclosure may also be applied to other various organic light emitting display devices, such as lighting devices or light emitting devices, as long as they include transistors.

The organic light emitting display device 100 according to embodiments of the disclosure may include a display panel (PNL) for displaying images or outputting light and a driving circuit for driving the display panel (PNL).

The organic light emitting display device 100 according to embodiments of the disclosure may be a bottom emission-type organic light emitting display device, which emits light toward the substrate on which light emitting elements are disposed, but the disclosure is not limited thereto. In some cases, the organic light emitting display device 100 of the disclosure may be a top emission-type electroluminescent display device, which emits light away from the substrate on which light emitting elements are disposed, or a dual emission-type electroluminescent display device which emits light towards and away from the substrate.

The display panel PNL may have a plurality of data lines DL and a plurality of gate lines GL. The display panel PNL may have a plurality of sub-pixels SP, defined by a plurality of data lines DL and a plurality of gate lines GL, arranged in a matrix type.

In the display panel PNL, the plurality of data lines DL and the plurality of gate lines GL may be disposed to cross each other. For example, the plurality of gate lines GL may be arranged in rows or columns, and the plurality of data lines DL may be arranged in columns or rows. For ease of description, it is assumed below that the plurality of gate lines GL are arranged in rows, and the plurality of data lines DL are arranged in columns.

The display panel PNL may have other types of signal lines, as well as the plurality of data lines DL and the plurality of gate lines GL, depending on, e.g., the subpixel structure. The display panel PNL may further have a driving power line, a reference power line, or a common power line.

The type of the signal lines disposed on the panel PNL may be varied depending on, e.g., the subpixel structure. In this disclosure, the concept of signal line may encompass signal-applied electrodes.

The display panel PNL may include an active area A/A for displaying pictures or images and a non-active area N/A, in which no image is displayed, around the active area A/A. The non-active area N/A is also referred to as a bezel area.

The active area A/A includes a plurality of subpixels SP for displaying images.

The non-active area N/A has a pad area for electrical connection with a data driver DDR. The non-active area N/A may have a plurality of data link lines to connect the pad area with the plurality of data lines DL. The plurality of data link lines may be extensions of the plurality of data lines DL to the non-active area N/A or may be separate patterns electrically connected with the plurality of data lines DL.

The non-active area N/A may also include gate driving-related lines to transfer voltage (signals) necessary for gate driving to a gate driver GDR through pads electrically connected with the data driver DDR. For example, the gate driving-related wires may include clock wires for transferring clock signals, gate power wires for transferring gate voltages VGH and VGL, and gate driving control signal wires for transferring various control signals necessary to generate scan signals. The gate driving-related lines are disposed in the non-active area N/A, unlike the gate lines GL disposed in the active area A/A.

The driving circuit may include the data driver DDR for driving the plurality of display device, the gate driver GDR for driving the plurality of gate lines GL, and a controller CTR for controlling the data driver DDR and the gate driver GDR.

The data driver DDR may drive the plurality of data lines DL by outputting data voltage to the plurality of data lines DL.

The gate driver GDR may drive the plurality of gate lines GL by outputting scan signals to the plurality of gate lines GL.

The controller CTR may control the driving operation of the data driver Data driver DDR and gate driver GDR by supplying various control signals DCS and GCS necessary for the driving operation of the data driver DDR and gate driver GDR. Further, the controller CTR may supply image data DATA to the data driver DDR.

The controller (CTR) starts scanning according to the timing implemented in each frame. The controller CTR converts input image data input from the outside into image data DATA suited for the data signal format used in the data driver DDR, outputs the image data DATA, and controls data driving at an appropriate time suited for scanning.

To control the data driver DDR and gate driver GDR, the controller CTR receives timing signals, such as a vertical sync signal Vsync, horizontal sync signal Hsync, input data enable signal (Data Enable (DE)), or clock signal CLK from the outside (e.g., a host system) and may generate various control signals. The controller CTR outputs the generated control signals to the data driver DDR and the gate driver GDR.

As an example, to control the gate driver GDR, the controller CTR outputs various gate control signals GCS including a gate start pulse GSP, a gate shift clock GSC, and a gate output enable signal (Gate Output Enable, GOE).

To control the data driver DDR, the controller CTR outputs various data control signals DCS including, e.g., a source start pulse SSP, a source sampling clock SSC, and a source output enable signal (Source Output Enable, SOE).

The controller CTR may be a timing controller used in a typical display technology. Alternatively, the controller CTR may be a control device capable of further performing other control functions including the timing controller.

The controller CTR may be implemented as a separate component from the data driver DDR. Alternatively, the controller CTR may be integrated with the data driver DDR in an integrated circuit.

The data driver DDR receives the image data DATA from the controller CTR and supply data voltage to the plurality of data lines DL, thereby driving the plurality of data lines DL. Here, the data driver DDR is also referred to as a source driver.

The data driver DDR may exchange various signals with the controller CTR via various interfaces.

The gate driver GDR sequentially drives the plurality of gate lines GL by sequentially supplying scan signals to the plurality of gate lines GL. Here, the gate driver GDR is also referred to as a scan driver.

The gate driver GDR sequentially supplies scan signals of On voltage or Off voltage to the plurality of gate lines GL under the control of the controller CTR.

When a specific gate line is opened by the gate driver GDR, the data driver DDR converts the image data DATA received from the controller CTR into an analog data voltage and supplies the analog data voltage to the plurality of data lines DL.

The data driver DDR may be positioned on one side (e.g., an upper or lower side) of the display panel PNL. However, embodiments of the disclosure are not limited thereto. For example, data drivers DDR may be positioned on both sides (e.g., both the upper and lower sides) of the display panel PNL depending on a driving scheme or a display panel design scheme.

The gate driver GDR may be positioned on one side (e.g., a left or right side) of the display panel PNL. However, embodiments of the disclosure are not limited thereto. For example, gate drivers GDR may be positioned on both the sides (e.g., both the left and right sides) of the display panel PNL depending on a driving scheme or a display panel design scheme.

The data driver DDR may include one or more source driver integrated circuits (SDICs).

Each source driver integrated circuit (SDIC) may include a shift register, a latch circuit, a digital-to-analog converter (DAC), and an output buffer. In some cases, the data driver DDR may further include one or more analog-digital converters ADC.

Each source driver integrated circuit SDIC may be connected, in a tape automated bonding (TAB) type or chip-on-glass (COG) type, to the bonding pad of the display panel PNL. Alternatively, each source driver integrated circuit SDIC may be directly disposed on the display panel PNL. In some cases, each source driver integrated circuit (SDIC) may be integrated and disposed on the display panel PNL. Each source driver integrated circuit (SDIC) may be implemented in a chip-on-film (COF) type. In this case, each source driver integrated circuit SDIC may be mounted on a circuit film. Each source driver integrated circuit SDIC mounted on the circuit film may be electrically connected to the data lines DL of the display panel PNL through the circuit film.

The gate driver GDR may include a plurality of gate driving circuits GDC. The plurality of gate driving circuits may respectively correspond to the plurality of gate lines GL.

Each gate driving circuit GDC may include, e.g., a shift register and a level shifter.

Each gate driving circuit GDC may be connected, in a tape automated bonding (TAB) type or chip-on-glass (COG) type, to the bonding pad of the display panel PNL. Each gate driving circuit GDC may be implemented in a chip-on-film (COF) scheme. In this case, each gate driving circuit GDC may be mounted on a circuit film. Each gate driving circuit GDC mounted on the circuit film may be electrically connected to the gate lines GL of the display panel PNL through the circuit film. Each gate driving circuit GDC may be implemented in a gate-in-panel (GIP) type and be embedded in the display panel PNL. Accordingly, each gate driving circuit GDC may be directly formed on the display panel PNL.

Figure 2:
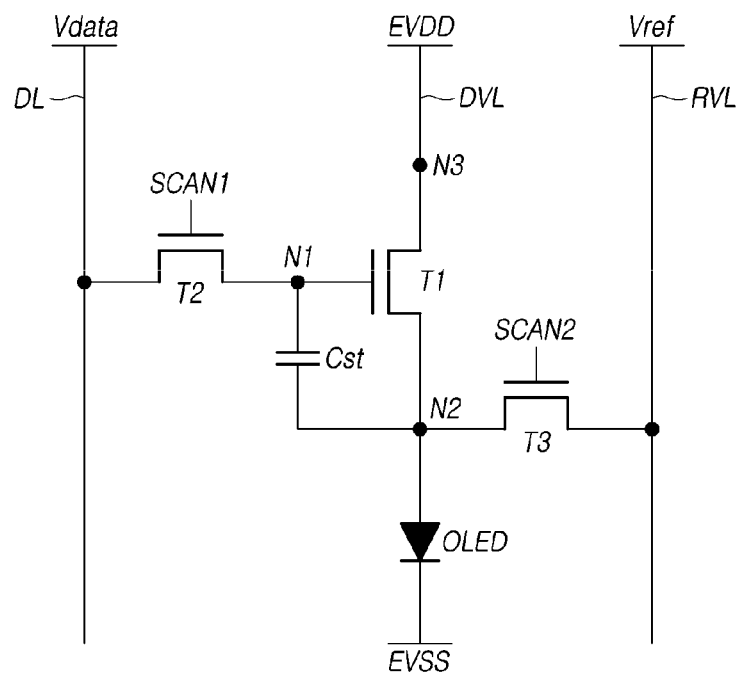
FIG. 2 is a view illustrating a structure of a subpixel when an organic light emitting display panel is an organic light emitting diode (OLED) organic light emitting display panel according to embodiments of the disclosure.

FIG. 2 is a view illustrating a structure of a subpixel SP when an organic light emitting display panel PNL is an organic light emitting diode (OLED) organic light emitting display panel according to embodiments of the disclosure.

Referring to FIG. 2, each subpixel SP in the organic light emitting display panel PNL which is an OLED organic light emitting display panel may further include a second transistor T2 to transfer data voltage Vdata to a first node N1, which corresponds to a gate node of the driving transistor T1, and a storage capacitor Cst to maintain the data voltage Vdata corresponding to an image signal voltage or a voltage corresponding to the data voltage Vdata for the time of one frame.

The organic light emitting diode OLED may include a first electrode (an anode electrode or cathode electrode), an organic layer including at least one light emitting layer, and a second electrode (a cathode electrode or anode electrode).

As an example, a base voltage EVSS may be applied to the second electrode of the organic light emitting diode OLED.

The driving transistor T1 drives the organic light emitting diode OLED by supplying a driving current to the organic light emitting diode OLED.

The driving transistor T1 includes the first node N1, second node N2, and third node N3.

The "node" in the first to third nodes N1, N2, and N3 may mean a point, electrode(s), or wiring(s) having the same electrical state.

Each of the first node N1, the second node N2, and the third node N3 may include one or more electrodes.

The first node N1 of the driving transistor T1 is a node corresponding to a gate node, and may be electrically connected to a source node or a drain node of the second transistor T2.

The second node N2 of the driving transistor T1 may be electrically connected with the first electrode 301 of the organic light emitting diode OLED, and may be a source node or a drain node.

The third node N3 of the driving transistor T1 may be a node to which driving voltage EVDD is applied, be electrically connected with a driving voltage line DVL for supplying the driving voltage EVDD, and be the drain node or source node.

The driving transistor T1 and the second transistor T2 may be implemented as an n-type or a p-type.

The second transistor T2 may be electrically connected between the data line DL and the first node N1 of the driving transistor T1, and may be controlled by receiving the scan signal SCAN through the gate line and the gate node.

The second transistor T2 may be turned on by the scan signal SCAN to transfer the data voltage Vdata supplied from the data line DL to the first node N1 of the driving transistor T1.

The storage capacitor Cst may be electrically connected between the first node N1 and second node N2 of the driving transistor T1.

The storage capacitor Cst is an external capacitor intentionally designed to be outside the driving transistor T1, but not a parasite capacitor (e.g., Cgs or Cgd) which is an internal capacitor present between the first node N1 and the second node N2 of the driving transistor T1.

The third transistor T3 may be electrically connected between the second node N2 of the driving transistor T1 and the reference voltage line RVL and receive a second scan signal SCAN2 through the gate node to be controlled for its on/off.

The drain node or source node of the third transistor T3 may be electrically connected to the reference voltage line RVL, and the source node or drain node of the third transistor T3 may be electrically connected to the second node N2 of the driving transistor T1.

The third transistor T3 may be turned on, e.g., in a display driving time period and be turned on in a sensing driving time period for sensing the characteristic values of the driving transistor T1 or the characteristic values of the organic light emitting diode OLED.

In sync with a relevant driving timing (e.g., a display driving timing or an initialization timing in the sensing driving time period), the third transistor T3 may be turned on by the second scan signal SCAN2, transferring the reference voltage Vref supplied to the reference voltage line RVL to the second node N2 of the driving transistor T1.

In sync with a relevant driving timing (e.g., a sampling timing in the sensing driving time period), the third transistor T3 may be turned on by the second scan signal SCAN2, transferring the voltage of the second node N2 of the driving transistor T1 to the reference voltage line RVL.

In other words, the third transistor T3 may control the voltage state of the second node N2 of the driving transistor T1 or may transfer the voltage of the second node N2 of the driving transistor T1 to the reference voltage line RVL.

The reference voltage line RVL may be electrically connected with an analog-to-digital converter that senses the voltage of the reference voltage line RVL, converts the voltage into a digital value, and outputs sensing data including the digital value.

The analog-to-digital converter may be included in the source driver integrated circuit SDIC that implements the data driver DDR.

The sensing data output from the analog-to-digital converter may be used to sense the characteristic values (e.g., threshold voltage or mobility) of the driving transistor T1 or the characteristic values (e.g., threshold voltage) of the organic light emitting diode OLED.

Each of the driving transistor T1, the second transistor T2, and the third transistor T3 may be an n-type transistor or a p-type transistor.

The first scan signal SCAN1 and the second scan signal SCAN2 may be separate gate signals. In this case, the first scan signal SCAN1 and the second scan signal SCAN2, respectively, may be applied to the gate node of the second transistor T2 and the gate node of the third transistor T3 through different gate lines.

In some cases, the first scan signal SCAN1 and the second scan signal SCAN2 may be the same gate signals. In this case, the first scan signal SCAN1 and the second scan signal SCAN2 may be jointly applied to the gate node of the second transistor T2 and the gate node of the third transistor T3 through the same gate line.

The structure of each subpixel illustrated in FIG. 2 is merely an example for description, and may further include one or more transistors or, in some cases, one or more storage capacitors.

The plurality of subpixels may have the same structure, or some of the plurality of subpixels may have a different structure.

Figure 3:
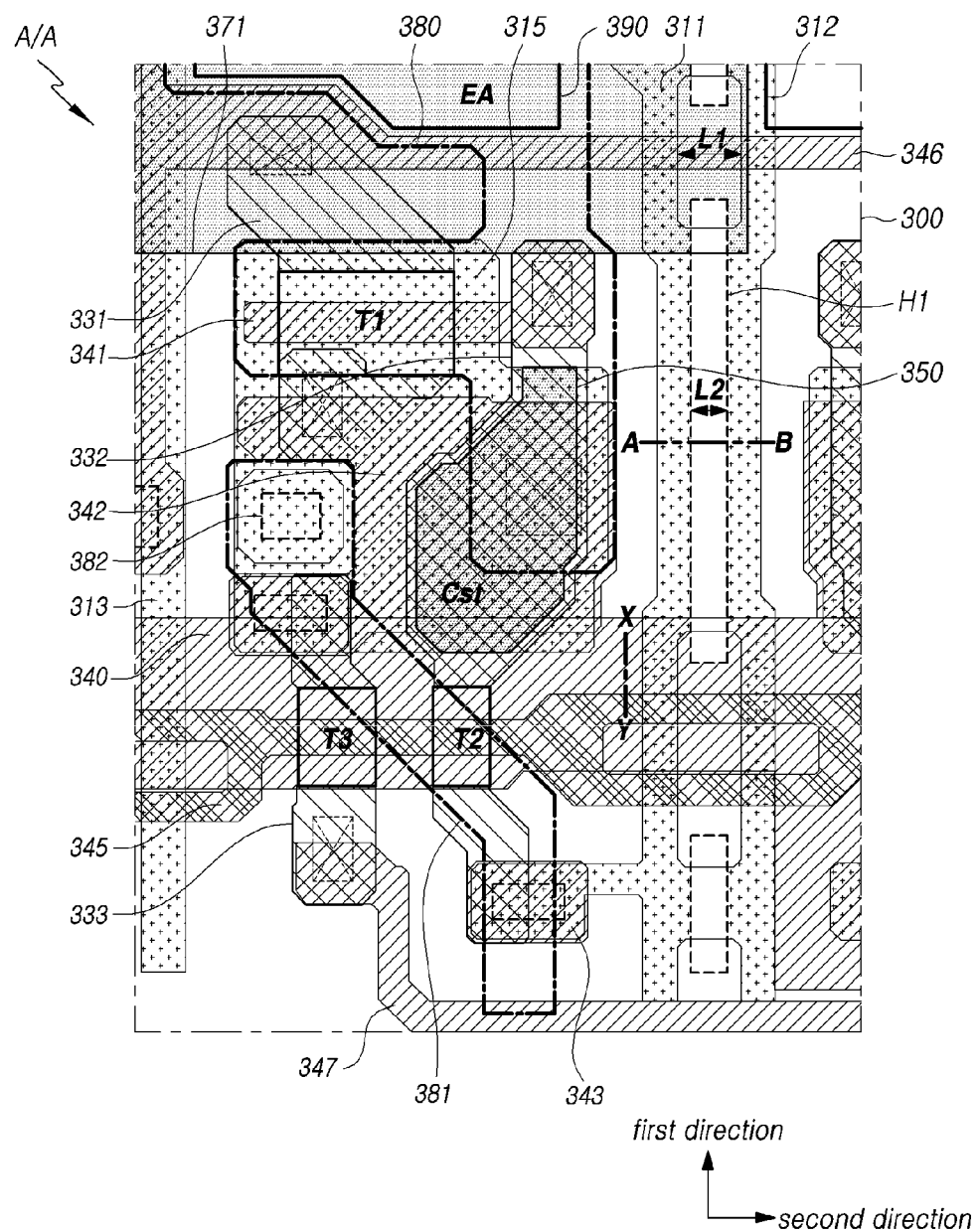
FIG. 3 is a plan view illustrating a partial area of subpixels disposed in an active area of an organic light emitting display device according to embodiments of the disclosure.

FIG. 3 is a plan view illustrating a partial area of subpixels disposed in an active area of an organic light emitting display device according to embodiments of the disclosure.

Referring to FIG. 3, at least one subpixel of the organic light emitting display device 100 according to embodiments of the disclosure may include an emission area EA and a non-emission area divided by a bank 390.

The emission area EA may not overlap the bank 390, and the non-emission area may overlap the bank 390.

An organic light emitting diode OLED including a first electrode, an organic layer, and a second electrode may be disposed in the emission area EA. A color filter 380 may be disposed in an area overlapping the organic light emitting diode OLED, but the disclosure is not limited thereto. For example, the color filter 380 may be disposed in only some subpixels among a plurality of subpixels included in the organic light emitting display device 100, and no color filter may be disposed in all subpixels included in the organic light emitting display device 100.

The color filter of FIG. 3 may be a red color filter 371 (hereinafter referred to as a first color filter), but embodiments of the disclosure are not limited thereto, and may be a green or blue color filter.

As illustrated in FIG. 3, one color filter may be disposed to overlap the entire emission area (EA) and a portion of the non-emission area.

A circuit area for driving the organic light emitting diode (OLED) may be disposed in the non-emission area.

A plurality of signal lines, a plurality of transistors, and a storage capacitor Cst may be disposed in the circuit area.

Specifically, a first signal line 311, a second signal line 312, a third signal line 313, a fourth signal line (not shown) and a first conductive layer 315 may be disposed on the substrate 300.

The first to fourth signal lines 311, 312, and 313 may be lines spaced apart from each other and extending in a first direction (e.g., a vertical direction).

The first and second signal lines 311 and 312 may be data lines, the third signal line 313 may be a driving voltage line, and the fourth signal line may be a reference voltage line.

However, embodiments of the disclosure are not limited thereto, and the third signal line 313 may be a data line or a reference voltage line.

At least one subpixel may be provided between the first signal line 311 and the third signal line 313.

The first signal line 311 and the second signal line 312 may be disposed in parallel with each other on the substrate 300 and be spaced apart from each other.

At least one first conductive layer 315 may be disposed between the first signal line 311 and the third signal line 313.

The first conductive layer 315 may absorb the light incident from the substrate 300 to prevent the light from being incident on the channel area of at least one active layer disposed on the first conductive layer 315.

A plurality of active layers 331, 332, and 333 may be disposed on the substrate 300 where the first to fourth signal lines 311, 312, and 313 and the first conductive layer 315 are disposed.

For example, a first active layer 331, a second active layer 332, and a third active layer 333 may be disposed in one subpixel.

Each of the first to third active layers 331, 332, and 333 may be an area in which the remaining area other than the channel area is rendered conductive.

Each of the first to third active layers 331, 332, and 333 may be formed of an oxide semiconductor. The material constituting the first to third active layers 331, 332, and 333 may be a metal oxide semiconductor and include an oxide of a metal among molybdenum (Mo), zinc (Zn), indium (In), gallium (Ga), tin (Sn), and titanium (Ti) or a combination of a metal among molybdenum (Mo), zinc (Zn), indium (In), gallium (Ga), tin (Sn), and titanium (Ti) and its oxide.

For example, each of the first to third active layers 331, 332, and 333 may include at least one of zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO), but the disclosure is limited thereto.

A portion of each of the first to third active layers 331, 332, and 333 may overlap a portion of the first conductive layer 315.

As illustrated in FIG. 3, a metal layer 350 may be disposed on a portion of the upper surface of the second active layer 332.

The metal layer 350 may include any one of metals, such as aluminum (Al), gold (Au), silver (Ag), copper (Cu), tungsten (W), molybdenum (Mo), chromium (Cr), tantalum (Ta), and titanium (Ti), or alloys thereof. For example, the meta layer 350 may be an alloy of molybdenum (Mo) and titanium (Ti), but the disclosure are not limited thereto.

An area where the second active layer 332 overlaps the metal layer 350 may be a non-conductive area, and an area in which the second active layer 332 does not overlap the metal layer 350 may be a conductive area.

The metal layer 350 may be disposed on the second active layer 332 to facilitate electrical connection with other components. The metal layer 350 may serve as a mask in the process of rendering the second active layer 332 conductive, thereby facilitating the process of rendering the second active layer 332 conductive without an additional mask.

The structure of the organic light emitting display device according to embodiments of the disclosure is not limited thereto, and a metal layer may be disposed on a portion of the upper surfaces of the first and third active layers 331 and 333.

A fifth signal line 345, a first extension 346, a second extension 347, a second conductive layer 341, and a third conductive layer 342 may be disposed on the substrate 300 where the first to third active layers 331, 332, and 333 are disposed.

The fifth signal line 345 may extend in a second direction (e.g., a horizontal direction).

The fifth signal line 345 may be a scan line.

The first extension 346 may be electrically connected to the third signal line 313. The plurality of subpixels may receive a driving voltage through the first extension 346.

The second extension 347 may be electrically connected to the fourth signal line. The plurality of subpixels may receive a reference voltage through the second extension 347.

The second conductive layer 341 may overlap a portion of each of the first and second active layers 331 and 332.

The third conductive layer 342 may overlap a portion of each of the first to third active layers 331, 332, and 333.

The third conductive layer 342 may overlap the metal layer 350 disposed between the second active layer 332 and the third conductive layer 342.

The area in which the first conductive layer 315, the metal layer 350, and the third conductive layer 342 overlap may be the area in which the storage capacitor Cst is positioned.

In other words, the first conductive layer 315, the metal layer 350, and the third conductive layer 342 may serve as electrodes of the storage capacitor Cst.

The circuit area of each subpixel may include a first transistor T1, a second transistor T2, and a third transistor T3.

The first transistor T1 may be a driving transistor, the second transistor T2 may be a switching transistor, and the third transistor T3 may be a sensing transistor, but embodiments of the disclosure are not limited thereto.

The first transistor T1 may include a first active layer 331 and a second conductive layer 341.

A partial area of the first active layer 331 is a conductive area and may serve as a source electrode and a drain electrode of the first transistor T1.

Specifically, as illustrated in FIG. 3, a portion of the first active layer 331 may be electrically connected to the first extension 346 through a contact hole, and another portion of the first active layer 331 may be electrically connected to the third conductive layer 342.

A portion in which the second conductive layer 341 overlaps the first active layer 331 may be a channel area of the first transistor T1.

The second conductive layer 341 may serve as a gate electrode of the first transistor T1.

A partial area of the second conductive layer 341 may be electrically connected to the second active layer 332 through a contact hole.

In other words, the second conductive layer 341 may be electrically connected to a partial area of the second active layer 332 serving as an electrode of the storage capacitor Cst.

The second transistor T2 may include a second active layer 332 and a fifth signal line 345.

A partial area of the second active layer 332 is a conductive area (area that does not overlap the metal layer) and may serve as a source electrode and a drain electrode of the second transistor T2.

Specifically, as illustrated in FIG. 3, a portion of the second active layer 332 may be integrated with the portion serving as an electrode of the storage capacitor Cst, and another portion of the second active layer 332 may be electrically connected to the conductive pattern 343 electrically connected to the first signal line 311.

A portion where the fifth signal line 345 overlaps the second active layer 332 may be a channel area of the second transistor T2.

The fifth signal line 345 may serve as a gate electrode of the second transistor T2.

The third transistor T3 may include a third active layer 333 and a fifth signal line 345.

A partial area of the third active layer 333 is a conductive area and may serve as a source electrode and a drain electrode of the third transistor T3.

Specifically, as illustrated in FIG. 3, a portion of the third active layer 333 may be electrically connected to the third conductive layer 342, and another portion of the third active layer 333 may be electrically connected to the second extension 347.

A portion where the fifth signal line 345 overlaps the third active layer 333 may be a channel area of the third transistor T3.

The fifth signal line 345 may serve as a gate electrode of the third transistor T3.

Referring to FIG. 3, a color filter 371 and a wavelength absorption layer 340 may be disposed on the substrate 300 where the fifth signal line 345, the first extension 346, the second extension 347, the second conductive layer 341, and the third conductive layer 342 are disposed.

The color filter 371 may be disposed to overlap the emission area EA and a portion of the non-emission area around the emission area EA.

The wavelength absorption layer 340 may be disposed to overlap the fifth signal line 345.

The wavelength absorption layer 340 may absorb light of a short wavelength generated in the redundancy process of the fifth signal line 345, preventing damage, e.g., a change in the electrical characteristic of the first to third transistors T1, T2, and T3 disposed in the circuit area due to a light wavelength of light.

The wavelength absorption layer 340 may include a material corresponding to a blue or red color filter, but embodiments of the disclosure are not limited thereto.

The first electrode 380 of the organic light emitting diode OLED may be disposed to overlap the emission area EA and a portion of the non-emission area surrounding the emission area EA.

The first electrode 380 may be the anode electrode or cathode electrode of the organic light emitting diode (OLED).

The first electrode 380 may be electrically connected to the third conductive layer 342 through a contact hole.

As illustrated in FIG. 3, a repair pattern 381 disposed on the same layer as the first electrode 380 may be disposed in the circuit area.

When a subpixel defect, such as a bright spot or a dark spot, occurs, the connection between the first electrode 380 and the circuit area may be disconnected by, e.g., a laser.

Thereafter, the repair pattern 381 may be electrically connected to the first conductive layer 315 through a welding process.

For example, the repair pattern 381 and the metal layer pattern 382 under the repair pattern 381 may contact each other. The metal layer pattern 382 may be disposed on the same layer as the metal layer 350.

The metal layer pattern 382 may be electrically connected to the first conductive layer 315.

Although not shown in FIG. 3, the repair pattern 381 may be electrically connected to the circuit area of another adjacent subpixel. The defective subpixel may be driven through an adjacent circuit area electrically connected to the repair pattern 381.

Referring to FIG. 3, the first signal line 311 and the second signal line 312 may be spaced apart from each other, and the spacing may differ per position.

Specifically, the spacing L1 (hereinafter, referred to as a first spacing) between the first signal line 311 and the second signal line 312 in the area where the first signal line 311 and the second signal line 312 overlap the fifth signal line 345, the first extension 346, or the second extension 347 may be larger than the spacing L2 (hereinafter, referred to as a second spacing) between the first signal line 311 and the second signal line 312 in the area where the first signal line 311 and the second signal line 312 do not overlap the fifth signal line 345, the first extension 346, or the second extension 347.

As illustrated in FIG. 3, in a partial area in which the first signal line 311 or second signal line 312 are adjacent to the fifth signal line 345, first extension 346, or second extension 347, the spacing between the first signal line 311 and second signal line 312 may correspond to the first spacing L1.

A patterning process (e.g., a lithography process) may be used to form the first signal line 311 or second signal line 312. However, rather than patterning using an etchant by forming a photoresist immediately on the material for forming the first signal line 311 or second signal line 312 in the area where the first signal line 311 or second signal line 312 do not overlap the fifth signal line 345, first extension 346, or second extension 347, a hole may be formed in the insulation film disposed on the material for forming the first signal line 311 or second signal line 312 so that the etchant penetrates into the material for forming the first signal line 311 or second signal line 312 upon patterning the fifth signal line 345, first extension 346, or second extension 347, and the first signal line 311 or second signal line 312 are indirectly patterned.

To manufacture without any defect, e.g., a short circuit, in the case of forming a photoresist immediately on the first signal line 311 or second signal line 312 and performing patterning using an etchant, the first signal line 311 or second signal line 312 should be spaced apart from each other by the first spacing L1 or more.

However, as the insulation film disposed on the first signal line 311 or second signal line 312 is patterned through the mask in at least a partial area of the circuit area, the first signal line 311 or second signal line 312 may be formed to have a second spacing L2 smaller than the first spacing L1 without defects.

Referring to FIG. 3, in the area where the spacing between the first signal line 311 and second signal line 312 is the second spacing L2, the insulation film disposed on the first signal line 311 or second signal line 312 may have a first hole H1.

Thus, upon patterning the fifth signal line 345, first extension 346, or second extension 347, the etchant may penetrated into the material used to form the first signal line 311 or second signal line 312 without being blocked by the insulation film.

Meanwhile, as the first hole H1 overlaps the whole area where the spacing between the first signal line 311 and second signal line 312 is the second spacing L2, the first hole H1 may also overlap a portion of the area where the spacing between the first signal line 311 and second signal line 312 is the first spacing L1.

As such, as the first hole H1 overlaps a portion of the area where the spacing between the first signal line 311 and second signal line 312 is the first spacing L1, the first signal line 311 and second signal line 312 may be spaced apart from each other without contacting each other although a processing error occurs.

The first spacing L1 and the second spacing L2 may mean the minimum length in the direction perpendicular to the direction in which the first signal line 311 or second signal line 312 are stacked on the substrate 300.

Thus, in at least one subpixel, the area where the spacing between the first signal line 311 and second signal line 312 is decreased may occur and, as the spacing between the first signal line 311 and second signal line 312 decreases, the area occupied by the circuit area in the active area A/A may be reduced, and the emission area EA may thus be increased as much as the reduced area of the circuit area.

FIGS. 4 to 9 are views schematically illustrating a manufacturing process for a partial area of an organic light emitting display device according to embodiments of the disclosure.

The structure of the cross section taken along A-B of FIG. 3 is described below with reference to FIGS. 4 to 9.

Substantially the same configurations and effects as those described above are not repeatedly described below. In the following description, the same reference numbers may be used to denote the same elements or components as those described in the above embodiments.

Figure 4:
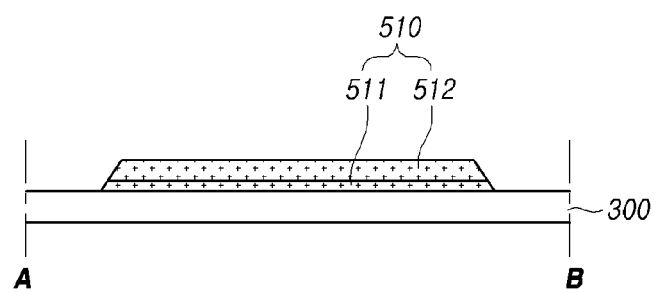
FIGS. 4, 5, 6, 7, 8, and 9 are views schematically illustrating a manufacturing process for a partial area of an organic light emitting display device according to embodiments of the disclosure.

Referring to FIG. 4, a signal line material layer 510 may be disposed on the substrate 300.

The signal line material layer 510 may include a first signal line material layer 511 disposed on the substrate 300 and a second signal line material layer 512 disposed on the first signal line material layer 511.

The first and second signal line material layers 511 and 512 each may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the disclosure is not limited thereto.

Figure 5:
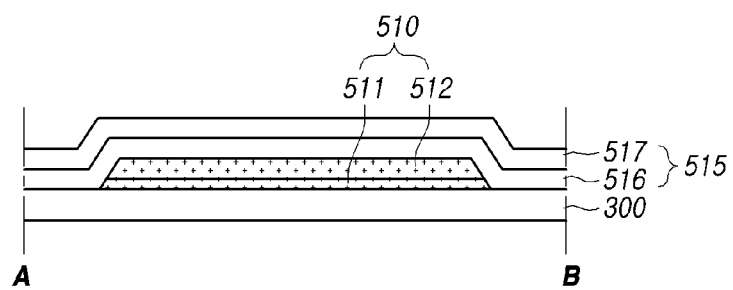

As shown in FIG. 5, the first insulation film material 515 may be disposed on the substrate 300 where the signal line material layer 510 is disposed.

As shown in FIG. 5, the first insulation film material 515 may include a first layer material 516 disposed on the first and second signal line material layers 511 and 512 and a second layer material 517 disposed on the first layer material 516.

The first insulation film material 515 may include an inorganic insulating material, such as silicon oxide (SiOx), silicon nitride (SiNx), or silicon oxynitride (SiON), but embodiments of the disclosure are not limited thereto.

Figure 6:
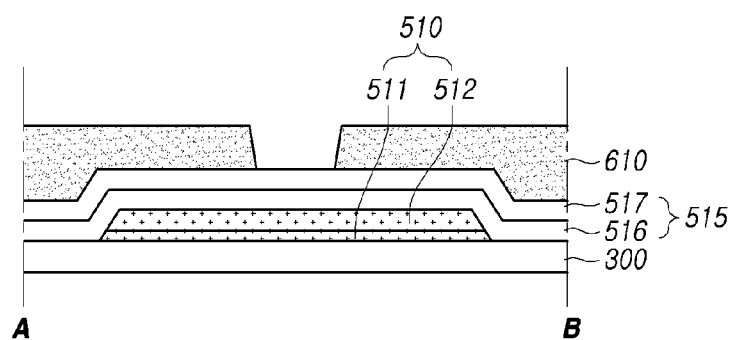

As illustrated in FIG. 6, a photoresist 610 may be disposed on a portion of the upper surface of the first insulation film material 515.

The photoresist 610 may be disposed not to overlap a portion of the signal line material layer 510.

The first insulation film material 515 may be patterned using the photoresist 610 as a mask.

Figure 7:
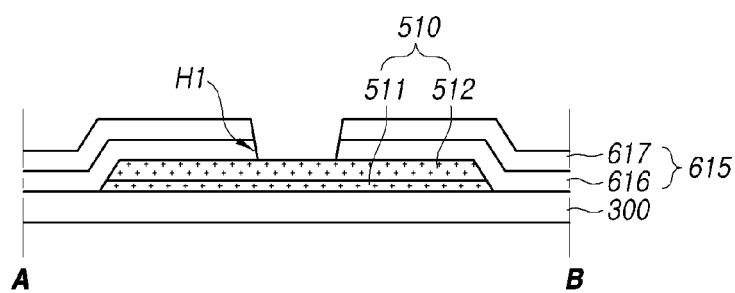

As shown in FIGS. 6 and 7, the first insulation film material 515 present in the area overlapping the photoresist 610 may remain on the substrate 300, and the first insulation film material 515 present in the area not overlapping the photoresist 610 may be removed so that the first insulation film 615 may be formed on the substrate 300.

The first insulation film 615 may include a first layer 616 disposed on the signal line material layer 510 and a second layer 617 disposed on the first layer 616.

The first layer 616 may be a buffer layer, and the second layer 617 may be a gate insulation film, but embodiments of the disclosure are not limited thereto.

Thereafter, as illustrated in FIG. 7, the photoresist 610 disposed on the first insulation film 615 may be removed.

The first insulation film 615 may have a first hole H1 exposing a portion of the upper surface of the signal line material layer 510.

Figure 8:
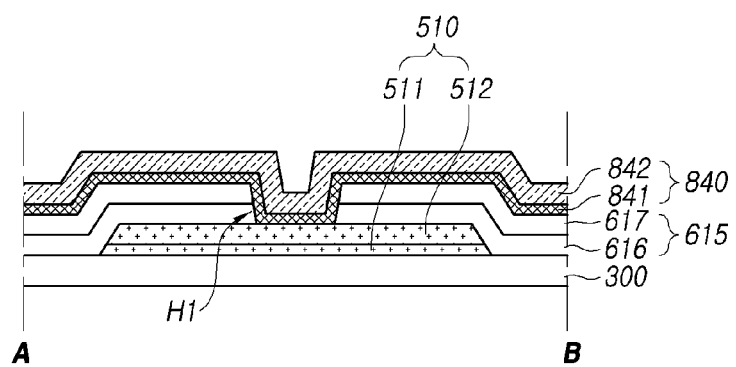

Then, as illustrated in FIG. 8, a gate material layer 840 may be disposed on the substrate 300.

The gate material layer 840 may include a first gate material layer 841 on the substrate 300 where the first insulation film 615 is disposed and a second gate material layer 842 on the first gate material layer 841.

The first and second gate material layers 841 and 842 each may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the disclosure is not limited thereto.

The gate material layer 840 may be disposed in the first hole H1 to contact a portion of the upper surface of the first signal line material layer 510.

The gate material layer 840 may be patterned and remain as a plurality of gate electrodes and a plurality of signal lines in a portion of the circuit area.

In the process of patterning the gate material layer 840, not only the gate material layer 840 provided in the first hole H1 but also the signal line material layer 510 may be patterned.

For example, in the process of patterning the gate material layer 840, a photoresist may be disposed on the gate material layer 840.

The photoresist may not be disposed where the gate material layer 840 is to be removed.

Thereafter, an etchant may be used to pattern the gate material layer 840.

The etchant may remove a metal material, such as the gate material layer 840.

Accordingly, the signal line material layer 510 in contact with the gate material layer 840 may also be exposed to the etchant to be patterned.

Figure 9:
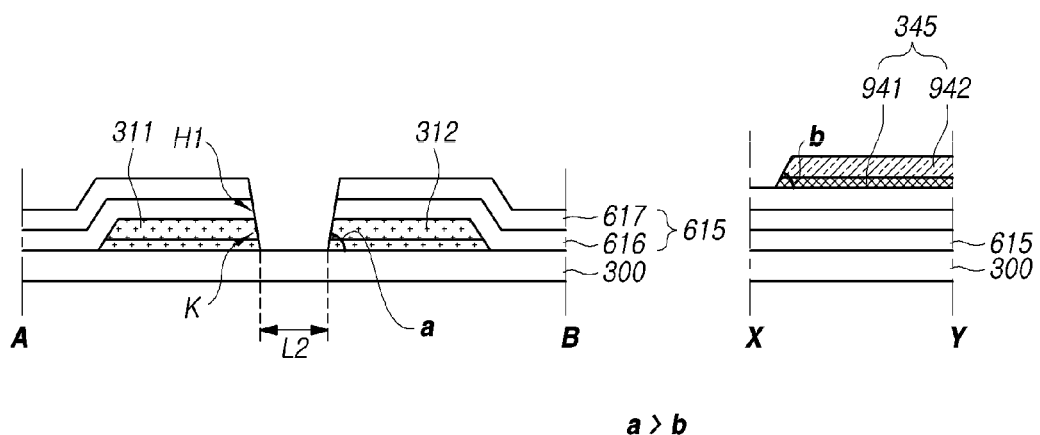

Specifically, as illustrated in FIG. 9, the signal line material layer 510 positioned to overlap the first hole H1 may be patterned when the gate material layer 840 is patterned.

In this case, a fifth signal line 345 may be formed, and the fifth signal line may be formed in a double-layer structure 941 and 942.

The first insulation film 615 may serve as a mask on the signal line material layer 510, and the signal line material layer 510 may be etched in the area corresponding to the area where the first insulation film 615 is not disposed. The signal line material layer 510 may not be etched in the area corresponding to the area where the first insulation film 615 is disposed.

As such, the patterned signal line material layer 510 may be the first signal line 311 and the second signal line 312.

A separation space K corresponding to the first hole H1 may be provided between the first signal line 311 and the second signal line 312.

The width of the separation space K may correspond to the second separation distance L2 of FIG. 3.

The taper angle a of the first and second signal lines 311 and 312 formed through the above-described process may be larger than the taper angle b of the fifth signal line 345 formed by patterning the gate material layer 840.

In other words, the taper angle a of the signal lines extending in the vertical direction may be larger than the taper angle b of the signal lines extending in the horizontal direction.

The taper angle a of the partial area of the signal line extending in the vertical direction, simultaneously patterned in the process of patterning the signal lines extending in the horizontal direction and disposed under the signal lines extending in the vertical direction among the signal lines extending in the horizontal direction may be larger than the taper angle b of the signal lines extending in the horizontal direction.

As described above, the plurality of signal lines disposed in the display device may be formed through a patterning process (including deposition, exposure, and etching).

In the process of forming each signal line, a short circuit may occur between adjacent signal lines and a plurality of electrodes due to a foreign material or a problem in the process. Particularly, when the width between the long signal lines is narrowed, the probability of a short circuit caused by a foreign material may increase.

Therefore, it has been proposed to increase the interval between signal lines to prevent a short circuit between signal lines.

However, when the interval between the signal lines is increased (e.g., 8 μm or more), the area of the circuit area, which is a non-emission area in the active area A/A, may increase, and it is difficult to secure the area of the opening (area where the bank is not disposed), which is the emission area, as the area of the circuit area increases.

However, referring to FIGS. 4 to 9, it is possible to reduce the interval between adjacent signal lines by patterning the lines (e.g., data lines, reference voltage line, and driving voltage line) extending in the vertical direction among the plurality of signal lines disposed adjacent to each other when patterning the gate material layer 840.

Accordingly, the area occupied by the circuit area in the active area A/A may be reduced, and the area of the opening which is the emission area may be increased by the reduced area of the circuit area.

A structure of an opening of an organic light emitting display device according to embodiments of the disclosure is described below with reference to FIGS. 10 and 11.

Figure 10:
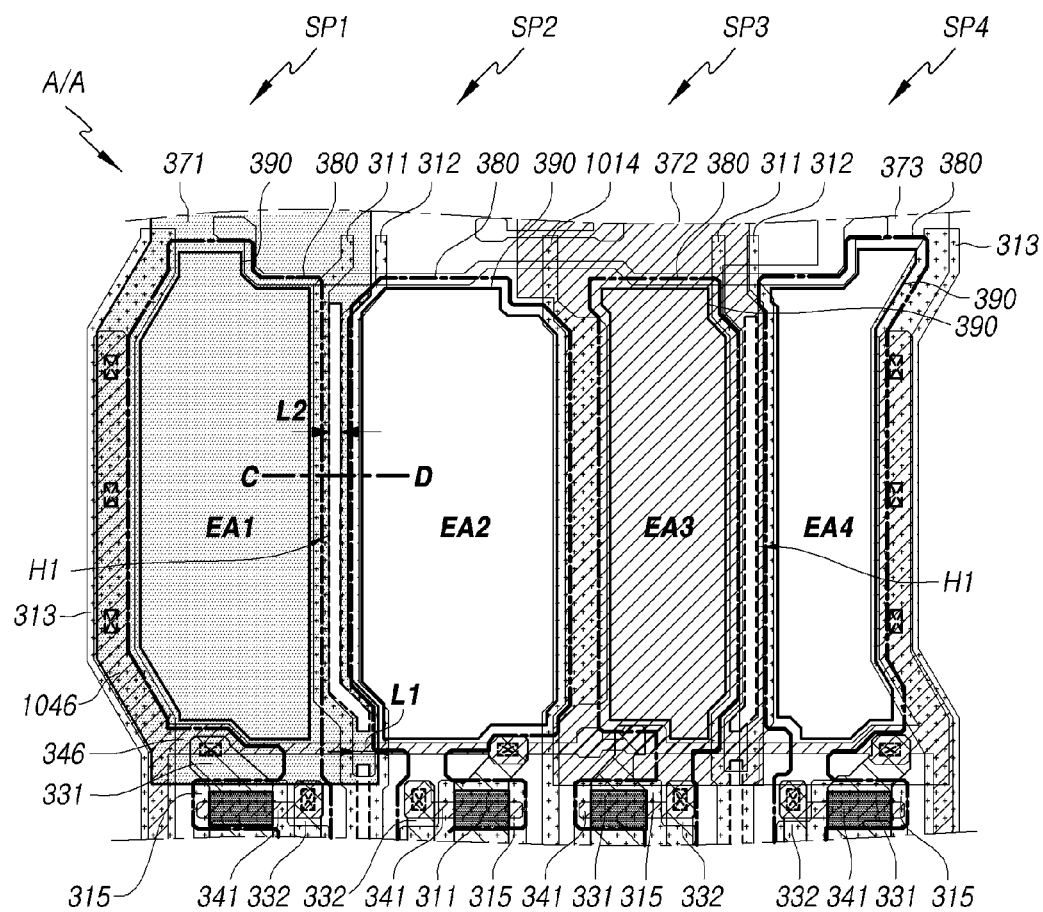
FIG. 10 is a plan view illustrating an opening (emission area) of one pixel and a portion of a non-emission area surrounding the opening in an organic light emitting display device according to embodiments of the disclosure.

FIG. 10 is a plan view illustrating an opening (emission area) of one pixel and a portion of a non-emission area surrounding the opening in an organic light emitting display device according to embodiments of the disclosure.

Substantially the same configurations and effects as those described above are not repeatedly described below. In the following description, the same reference numbers may be used to denote the same elements or components as those described in the above embodiments.

Referring to FIG. 10, a plurality of sub-pixels SP1, SP2, SP3, and SP4 may be disposed in the active area A/A of the organic light emitting display device 100 according to embodiments of the disclosure. Each of the sub-pixels SP1, SP2, SP3, and SP4 may include at least one emission area EA1, EA2, EA3, and EA4 and at least one circuit area.

For example, a first sub-pixel SP1 may include a first emission area EA1 and a circuit area, a second sub-pixel SP2 may include a second emission area EA2 and a circuit area, a third sub-pixel SP3 may include a third emission area EA3 and a circuit area, and a fourth sub-pixel SP4 may include a fourth emission area EA4 and a circuit area.

The first subpixel SP1, the second subpixel SP2, the third subpixel SP3, and the fourth subpixel SP4 may be included in one pixel, but embodiment of the disclosure are not limited thereto. The organic light emitting display device 100 according to embodiments of the disclosure may suffice as long as one pixel includes two or more subpixels.

The first emission area EA1 may be an area in which red light is emitted, the second emission area EA2 may be an area in which white light is emitted, the third emission area EA3 may be an area in which blue light is emitted, and the fourth emission area EA4 may be an area in which green light is emitted, but the disclosure is not limited thereto.

A first color filter 371 larger in area than the first emission area EA1 may be disposed in an area corresponding to the first emission area EA1. A second color filter 372 larger in area than the third emission area EA3 may be disposed in an area corresponding to the third emission area EA3. A third color filter 373 larger in area than the fourth emission area EA4 may be disposed in an area corresponding to the fourth emission area EA4.

No color filter may be disposed in an area corresponding to the second emission area EA2, but embodiments of the disclosure are not limited thereto.

The first color filter 371 may be a red color filter, the second color filter 372 may be a blue color filter, and the third color filter 373 may be a green color filter.

At least two emission areas among the first to fourth emission areas EA1, EA2, EA3, and EA4 may be different in size from each other and, in some cases, the first to fourth emission areas EA1, EA2, EA3, and EA4 may have the same size.

A plurality of signal lines may be disposed in the active area A/A.

For example, as illustrated in FIG. 10, there may be included a first signal line 311, a second signal line 312, a third signal line 313, and a fourth signal line 1014 extending in the same direction.

Referring to FIG. 10, a line electrically connected to the third signal line 313 may be included. A portion of the line electrically connected to the third signal line 313 may include a first extension 346 extending in a direction crossing the extension direction of the first to fourth signal lines 311, 312, 313, and 1014.

The first extension 346 may be electrically connected to the first active layer 311 included in the first transistor T1 of each subpixel.

The first extension 346 may overlap a portion of the third signal line 313 and may be integrally formed with the vertical portion 1046 connected with the third signal line 313 through a contact hole.

The first emission area EA1 may be disposed between the first signal line 311 and the third signal line 313, the second emission area EA2 may be disposed between the second signal line 312 and the fourth signal line 1014, the third emission area EA3 may be disposed between the fourth signal line 1014 and another first signal line 311, and the fourth emission area EA4 may be disposed between another second signal line 312 and another third signal line 313.

In other words, as illustrated in FIG. 10, only one of at least two signal lines 313 and 1014 among the first to fourth signal lines 311, 312, 313, and 1014 may be disposed, without being adjacent to other signal lines, between two emission areas of one pixel. For example, each of the third signal line 313 and the fourth signal line 1014 may be disposed between the two emission areas without being adjacent to other signal lines.

Since the third and fourth signal lines 313 and 1014 are disposed alone without other adjacent signal lines extending in the same direction, between the two emission areas of one pixel, the interval may be adjusted considering a short circuit with other adjacent signal lines.

Among the first to fourth signal lines 311, 312, 313, and 1014, at least two signal lines 311 and 312 may be disposed adjacent to emission area between the two emission areas of one pixel. For example, the first and second signal lines 311 and 312 may be disposed to be spaced apart from each other between the two emission areas (first and second emission areas).

Since the first and second signal lines 311 and 312 are disposed to be adjacent to each other between two light emitting areas of one pixel, the interval may be properly adjusted, to, at least, the second spacing L2, not to cause a short circuit in the first and second signal lines 311 and 312 as the area of the circuit area is reduced.

An organic light emitting diode OLED may be disposed in each emission area EA1, EA2, EA3, and EA4.

A bank 390 may be disposed on the first electrode 380 of an organic light emitting diode OLED. The area where the first electrode 380 and the bank 390 do not overlap may be the respective emission areas EA1, EA2, EA3, and EA4 of the subpixels SP1, SP2, SP3, and SP4, and the remaining area may be a non-emission area.

The first to fourth signal lines 311, 312, 313, and 1014 may be disposed in the non-emission area of the active area A/A.

The first signal line 311 and the second signal line 312 may be disposed to be spaced apart from each other.

The first signal line 311 and the second signal line 312 may be spaced apart by the first separation distance L1 in some areas and may be spaced apart by the second separation distance L2 in other areas.

In the area where the first and second signal lines 311 and 312 overlap the first extension 346 and the partial area where the first and second signal lines 311 and 312 are adjacent to the first extension 346, the spacing between the first signal line 311 and the second signal line 312 may correspond to the first spacing L1.

The spacing between the first and second signal lines 311 and 312 in the remaining area may be the second spacing L2 shorter than the first spacing L1.

As shown in FIG. 10, the area where the spacing between the first and second signal lines 311 and 312 is the second spacing L2 may be areas between the first and second emission areas EA1 and EA2 and between the third and fourth emission areas EA3 and EA4.

As the spacing between the first and second signal lines 311 and 312 reduces, the area of the non-emission area (circuit area where the signal lines are disposed) may be decreased and, as the area of the non-emission area is decreased, the area of the emission areas EA1, EA2, EA3, and EA4 may be increased.

Accordingly, the light efficiency of the display device 100 may be enhanced.

Referring to FIG. 10, in the area corresponding to the area between the first and second signal lines 311 and 312 in the non-emission area of the active area A/A, the first hole H1 may be provided in the insulation film disposed on the first and second signal lines 311 and 312.

This is described below with reference to FIG. 11.

Figure 11:
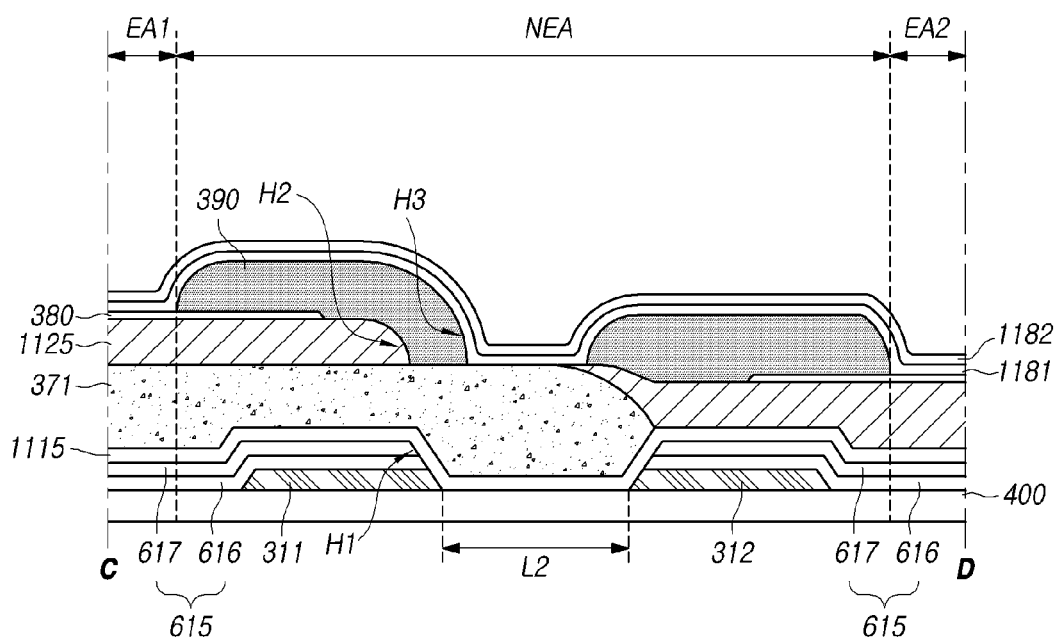
FIG. 11 is a cross-sectional view taken along line C-D of FIG. 10.

FIG. 11 is a cross-sectional view taken along line C-D of FIG. 10.

Substantially the same configurations and effects as those described above are not repeatedly described below. In the following description, the same reference numbers may be used to denote the same elements or components as those described in the above embodiments.

Referring to FIG. 11, the first and second signal lines 311 and 312 may be disposed on the substrate 300 to be spaced apart from each other.

The spacing between the first signal line 311 and the second signal line 312 may be the second spacing L2.

The first insulation film 615 may be disposed on the substrate 300 where the first and second signal lines 311 and 312 are disposed.

In this case, the first insulation film 615 may have the first hole H1 in the area corresponding to the area where the first and second signal lines 311 and 312 are spaced apart.

A second insulation film 1115 may be disposed on the substrate 300 where the first insulation film 615 is disposed.

The second insulation film 1115 may also be disposed in the area corresponding to the first hole H1 of the first insulation film 615 and may be disposed in the separation space between the first and second signal lines 311 and 312.

Although not shown in FIG. 11, the fifth signal line and the first and second extensions may be disposed on the layer between the first insulation film 615 and the second insulation film 1115.

A first color filter 371 may be disposed on the second insulation film 1115.

The first color filter 371 may be disposed in a portion of the non-emission area NEA around the first emission area EA1 and the first emission area EA1.

As illustrated in FIG. 11, the first color filter 371 may be disposed to overlap the separation space between the first and second signal lines 311 and 312 and the first hole H1 of the first insulation film 615 in the non-emission area NEA.

A third insulation film 1125 may be disposed on the substrate 300 where the first color filter 371 is disposed.

The third insulation film 1125 may be disposed to expose a portion of the upper surface of the first color filter 317 in the non-emission area NEA.

As illustrated in FIG. 11, the third insulation film 1125 may have a second hole H2, and at least a portion of the second hole H2 may overlap at least a portion of the first hole H1 of the first insulation film 615.

In this case, the third insulation film 1125 may not overlap at least a portion of the separation space between the first and second signal lines 311 and 312 and at least a portion of the first hole H1 of the first insulation film 615.

The first electrode 380 of the organic light emitting diode OLED may be disposed on the third insulation film 1125.

The first electrode 380 may be disposed for each subpixel.

A bank 390 may be disposed on the third insulation film 1125 where the first electrode 380 is disposed.

The bank 390 may be disposed to expose a portion of the upper surface of the first electrode 380.

The area where the first electrode 380 does not overlap the bank 390 may be the emission areas EA1 and EA2 of each subpixel.

The bank 390 may be disposed to expose a portion of the upper surface of the first color filter 317 in the non-emission area NEA.

As illustrated in FIG. 11, the bank 390 may have a third hole H3, and at least a portion of the third hole H3 may overlap at least a portion of the first hole H1 of the first insulation film 615 and at least a portion of the second hole H2 of the third insulation film 1125.

The organic layer 1181 of the organic light emitting diode OLED may be disposed on the substrate 300 where the bank 390 is disposed.

The organic layer 1181 may include a light emitting layer and may emit, e.g., white light but embodiments of the disclosure are not limited thereto.

The second electrode 1182 may be disposed on the organic layer 1181.

The first electrode 380 may include a transparent conductive material. For example, the first electrode 380 may include any one of indium tin oxide (ITO), indium zinc oxide (IZO), and indium gallium zinc oxide (IGZO), but embodiments of the disclosure are not limited thereto.

The second electrode 1182 may include a reflective conductive metal. For example, the second electrode 1182 may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but embodiments of the disclosure are not limited thereto.

The light emitted from the organic light emitting diode OLED may be emitted to the outside in a direction toward the substrate 300.

Referring to FIG. 11, among the light emitted from the first emission area EA1, the light directed to the second emission area EA2 may be reflected or refracted by the second electrode 1182 disposed along the third hole H3 of the bank 390 and pass through the first color filter 371 disposed up to the non-emission area NEA and the space between the first and second signal lines 311 and 312 to the outside of the substrate 300.

Accordingly, the light emitted from the first emission area EA1 may be prevented from passing to another emission area.

The width of the third hole H3 may be smaller than the width of the second hole H2, and the width of the second hole H2 may be smaller than the width of the first hole H1.

The width of the first hole H1, the second hole H2, and the third hole H3 may be the maximum length in a direction perpendicular to the direction in which the first insulation film 615 is stacked on the first and second signal lines 311 and 312 on the substrate 300.

Accordingly, although the light is reflected by the second electrode 1182 disposed along the third hole H3, and its path is changed in several directions, a large amount of light may be emitted to the outside of the substrate 300 without being absorbed or trapped in the display device as the second hole H2 and the first hole H1 are formed to have a large width.

Although the foregoing description made in connection with FIG. 11 focuses primarily on a bottom emission organic light emitting display structure, the organic light emitting display device according to embodiments of the disclosure is not limited thereto, but may also be of a top emission or side emission type.

The foregoing embodiments are briefly described below.

An organic light emitting display device may include an organic light emitting display panel including a first emission area EA1 and a second emission area EA2 disposed adjacent to the first emission area EA1 and emit a different color of light from the first emission area EA1. The organic light emitting display panel may include a substrate 300, a first signal line 311 disposed on the substrate 300 between the first emission area EA1 and the second emission area EA2 and a second signal line 312 spaced apart from the first signal line 311, a first insulation film 615 disposed on the first signal line 311 and the second signal line 312 and having a first hole H1 corresponding to a separation space between the first signal line 311 and the second signal line 312, and a second insulation film 1115 disposed on the first insulation film 615. The second insulation film 1115 may be disposed in the separation space between the first signal line 311 and the second signal line 312 and the first hole H1 of the first insulation film 615.

A first spacing L1 and a second spacing L2 shorter than the first spacing L1 may be present between the first signal line 311 and the second signal line 312.

An area where a distance between the first and second signal lines 311 and 312 is the first spacing L1 may be an area where the first and second signal lines 311 and 312 overlap a fifth signal line 345 extending in a direction crossing the first and second signal lines 311 and 312 and any one of a first extension 346 and a second extension 347 disposed on a same layer as the fifth signal line 345.

The first hole H1 may overlap a portion of the area where the distance between the first and second signal lines 311 and 312 is the first spacing L1.

An area where the distance between the first and second signal lines 311 and 312 is the second spacing L2 may be an area where the first and second signal lines 311 and 312 do not overlap a fifth signal line 345 extending in a direction crossing the first and second signal lines 311 and 312 and a first extension 346 and second extension 347 disposed on a same layer as the fifth signal line 345.

The first hole H1 may overlap the whole area where the distance between the first and second signal lines 311 and 312 is the second spacing L2.

The organic light emitting display device may further comprise a third emission area EA3 and a fourth emission area EA4 adjacent to each other and emitting a different color of light from the first and second emission areas EA1 and EA2. The first signal line 311 and the second signal line 312 may be further disposed between the third emission area EA3 and the fourth emission area EA4.

Between the third and fourth emission areas EA3 and EA4, a first spacing L1 and a second spacing L2 shorter than the first spacing L1 may be present between the first signal line 311 and the second signal line 312.

A fourth signal line extending in a direction the same as the first and second signal lines 311 and 312 may be disposed between the second emission area EA2 and the third emission area EA3. A third signal line 313 extending in a direction the same as the first and second signal lines 311 and 312 may be disposed between the first emission area EA1 and another fourth emission area EA4 or between another first emission area EA1 and the fourth emission area EA4. The first insulation film 615 may not have the first hole H1 between the second emission area EA2 and the third emission area EA3 and between the first emission area EA1 and another fourth emission area EA4 or between another first emission area EA1 and the fourth emission area EA4.

A taper angle b between a fifth signal line 345 extending in a direction the same as the first and second signal lines 311 and 312 and a first extension 346 and second extension 347 disposed on a same layer as the fifth signal line 345 may be smaller than a taper angle a of the first and second signal lines 311 and 312.

The organic light emitting display device may further comprise a color filter 371 disposed on the second insulation film 1115. The color filter 371 may overlap the separation space between the first and second signal lines 311 and 312 and the first hole H1 of the first insulation film 615 in a non-emission area around the first and second emission areas EA1 and EA2.

The organic light emitting display device may further comprise a third insulation film 1125 disposed on the color filter 371. The third insulation film 1125 may include a second hole H2 exposing a portion of an upper surface of the color filter 371 in the non-emission area. The second hole H2 may overlap at least a portion of each of the separation space between the first and second signal lines 311 and 312 and the first hole H1 of the first insulation film 615.

The organic light emitting display device may further comprise a bank 390 disposed on the third insulation film 1125. The bank 390 may include a third hole H3 exposing the portion of the upper surface of the color filter 371 in the non-emission area. The third hole H3 may overlap at least a portion of each of the separation space between the first and second signal lines 311 and 312 and the first hole H1 of the first insulation film 615.

The first insulation film 615 and the second insulation film 1115 may include an inorganic insulation material, and the third insulation film 1125 may include an organic insulation material.

According to embodiments of the disclosure, there may be provided an organic light emitting display device and an organic light emitting display panel capable of enhancing optical characteristics by decreasing the spacing between the signal lines arranged in the circuit area and hence increasing the emission area.

According to embodiments of the disclosure, there may be provided an organic light emitting display device and an organic light emitting display panel capable of facilitating a process of forming signal lines arranged adjacent to each other and reducing defects.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure. Thus, the scope of the disclosure is not limited to the embodiments shown. The scope of protection of the disclosure should be construed based on the following claims, and all technical ideas within the scope of equivalents thereof should be construed as being included within the scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display device including an organic light emitting display panel including a first emission area and a second emission area disposed adjacent to the first emission area, the second emission area emitting a different color of light from the first emission area, the organic light emitting display panel comprising:
    a substrate;
    a first signal line disposed on the substrate between the first emission area and the second emission area and a second signal line spaced apart from the first signal line;
    a first insulation film disposed on the first signal line and the second signal line and having a first hole corresponding to a separation space between the first signal line and the second signal line; and
    a second insulation film disposed on the first insulation film,
    wherein the second insulation film is disposed in the separation space between the first signal line and the second signal line and the first hole of the first insulation film, and
    wherein the first insulation film is not disposed on side surfaces of the first signal line and the second signal line in the separation space between the first signal line and the second signal line.

2. The organic light emitting display device of claim 1, wherein a first spacing and a second spacing shorter than the first spacing are present between the first signal line and the second signal line.

3. The organic light emitting display device of claim 2, wherein an area where a distance between the first and second signal lines is the first spacing is an area where the first and second signal lines overlap a fifth signal line extending in a direction crossing the first and second signal lines and any one of a first extension and a second extension disposed on a same layer as the fifth signal line.

4. The organic light emitting display device of claim 3, wherein the first hole overlaps a portion of the area where the distance between the first and second signal lines is the first spacing.

5. The organic light emitting display device of claim 2, wherein an area where the distance between the first and second signal lines is the second spacing is an area where the first and second signal lines do not overlap a fifth signal line extending in a direction crossing the first and second signal lines and a first extension and second extension disposed on a same layer as the fifth signal line.

6. The organic light emitting display device of claim 5, wherein the first hole overlaps the whole area where the distance between the first and second signal lines is the second spacing.

7. The organic light emitting display device of claim 1, further comprising:
    a third emission area and a fourth emission area adjacent to each other and emitting a different color of light from the first and second emission areas,
    wherein the first signal line and the second signal line are further disposed between the third emission area and the fourth emission area.

8. The organic light emitting display device of claim 7, wherein between the third and fourth emission areas, a first spacing and a second spacing shorter than the first spacing are present between the first signal line and the second signal line.

9. The organic light emitting display device of claim 7, wherein
a fourth signal line extending in a direction the same as the first and second signal lines is disposed between the second emission area and the third emission area;
a third signal line extending in a direction the same as the first and second signal lines is disposed between the first emission area and another fourth emission area or between another first emission area and the fourth emission area; and
the first insulation film does not have the first hole between the second emission area and the third emission area and between the first emission area and another fourth emission area or between another first emission area and the fourth emission area.

10. The organic light emitting display device of claim 1, wherein a taper angle between a fifth signal line extending in a direction the same as the first and second signal lines and a first extension and second extension disposed on a same layer as the fifth signal line is smaller than a taper angle of the first and second signal lines.

11. The organic light emitting display device of claim 1, further comprising:
a color filter disposed on the second insulation film,
wherein the color filter overlaps the separation space between the first and second signal lines and the first hole of the first insulation film in a non-emission area around the first and second emission areas.

12. The organic light emitting display device of claim 11, further comprising:
a third insulation film disposed on the color filter,
wherein the third insulation film includes a second hole exposing a portion of an upper surface of the color filter in the non-emission area, and
wherein the second hole overlaps at least a portion of each of the separation space between the first and second signal lines and the first hole of the first insulation film.

13. The organic light emitting display device of claim 12, further comprising:
a bank disposed on the third insulation film,
wherein the bank includes a third hole exposing the portion of the upper surface of the color filter in the non-emission area, and
wherein the third hole overlaps at least a portion of each of the separation space between the first and second signal lines and the first hole of the first insulation film.

14. The organic light emitting display device of claim 12, wherein
the first insulation film and the second insulation film include an inorganic insulation material; and
the third insulation film includes an organic insulation material.

15. The organic light emitting display device of claim 1, further comprising:
a plurality of circuit areas driving the first and second emission areas,
wherein a storage capacitor is disposed in each of the plurality of circuit areas, and
wherein the storage capacitor includes a first conductive layer disposed on a same layer as the first and second signal lines, a metal layer contacting an upper surface of an active layer disposed on the first conductive layer, and a third conductive layer disposed on the metal layer.

16. The organic light emitting display device of claim 13, wherein a width of the third hole is smaller than a width of the second hole, and the width of the second hole is smaller than a width of the first hole.

17. An organic light emitting display panel, comprising:
a substrate including a first emission area and a second emission area disposed adjacent to the first emission area that emits a different color of light from the first emission area;
a first signal line disposed on the substrate between the first emission area and the second emission area and a second signal line spaced apart from the first signal line;
a first insulation film disposed on the first signal line and the second signal line and having a first hole corresponding to a separation space between the first signal line and the second signal line; and
a second insulation film disposed on the first insulation film,
wherein the second insulation film is disposed in the separation space between the first signal line and the second signal line and the first hole of the first insulation film, and
wherein the first insulation film is not disposed on side surfaces of the first signal line and the second signal line in the separation space between the first signal line and the second signal line.

18. The organic light emitting display device of claim 1, wherein the second insulation film is disposed in contact with side surfaces of the first signal line and the second signal line.

19. The organic light emitting display device of claim 1, wherein the second insulation film is disposed in contact with side surfaces of the first insulation film in the first hole.

* * * * *